(12) United States Patent
Barcley

(10) Patent No.: US 6,820,328 B2
(45) Date of Patent: Nov. 23, 2004

(54) METHOD OF REMOVING HEAT FROM AN ELECTRONIC ASSEMBLAGE

(75) Inventor: Tina P. Barcley, Mendon, NY (US)

(73) Assignee: Eastman Kodak Company, Rochester, NY (US)

( * ) Notice: Subject to any disclaimer, the term of this patent is extended or adjusted under 35 U.S.C. 154(b) by 30 days.

(21) Appl. No.: 10/328,337

(22) Filed: Dec. 23, 2002

(65) Prior Publication Data

US 2004/0117982 A1 Jun. 24, 2004

(51) Int. Cl.$^7$ ................................. H05K 3/30
(52) U.S. Cl. ..................... 29/832; 29/825; 29/840; 29/846; 174/16.3
(58) Field of Search ..................... 29/825, 832, 840, 29/846; 174/16.3; 361/767

(56) References Cited

U.S. PATENT DOCUMENTS

| | | | | |
|---|---|---|---|---|
| 5,543,661 A | | 8/1996 | Sumida | |
| 5,796,170 A | | 8/1998 | Marcantonio | |
| 5,959,356 A | * | 9/1999 | Oh | 257/738 |
| 5,982,630 A | * | 11/1999 | Bhatia | 361/767 |
| 6,031,729 A | * | 2/2000 | Berkely et al. | 361/771 |
| 6,032,355 A | * | 3/2000 | Tseng et al. | 29/840 |
| 6,160,705 A | | 12/2000 | Stearns et al. | |
| 6,414,847 B1 | * | 7/2002 | Hutchison et al. | 361/704 |

* cited by examiner

Primary Examiner—Carl J. Arbes
(74) Attorney, Agent, or Firm—Clyde E. Bailey, Sr.

(57) ABSTRACT

A method removes heat from a densely packed electronic assemblage. Densely packed electronic assemblage has a substrate medium for supporting at least one heat generating component and means for reducing the temperature of the at least one heat generating component. A heat sink cooperates with the heat removing element for reducing heat of the heat generating component by absorbing heat from the heat generating component.

15 Claims, 4 Drawing Sheets

METHOD OF REMOVING HEAT FROM AN ELECTRONIC ASSEMBLAGE

CROSS-REFERENCE TO RELATED APPLICATIONS

The present application is related to U.S. Application Ser. No. 10/327,839 filed, Dec. 23, 2002, by Tina P. Baroley, and titled, "Electrical Assemblage And Method For Removing Heat Locally Generated Therefromt"; U.S. Application Ser. No. 10/328,332 filed, Dec. 23, 2002, by Tina P. Barcley, and titled, "Remote Thermal Vias For Densely Packed Electrical Assemblage"; and U.S. Application Ser. No. 10/328,312, filed Dec. 23, 2002, by Tina P. Barcley, and titled, "Densely Packed Electronic Assemblage With Heat Removing Element."

FIELD OF THE INVENTION

The invention relates generally to the field of broad electronic technology (BET), and in particular to thermal management of highly dense circuit boards. More specifically, the invention relates to a method of reducing the heat of heat-generating electronic components during service.

BACKGROUND OF THE INVENTION

It is well known in the field of electronic technology that overheating electronic components, such as transistors, capacitors, etc., contributes to reducing the life of the component or module as well as the overall reliability while in service. As electrical assemblages or products containing such components become denser and contain components that have higher wattages per square area, component overheating becomes a larger problem as well as a limiting factor in the reliability of the electrical assemblage. Thus, eliminating or substantially reducing the heat from such components during service must be accomplished before product reliability can be greatly improved. The performance and reliability of commercial electronic products are simply limited by the inability of the products to dissipate heat generated by densely packed electrical components.

Prior art attempts to address the aforementioned problem has resulted in varying degrees of success. In the area of commercial electronics, such as computer electronics, the most common solution is to utilize costly component constructions. In the automotive electronic area, costly circuit board materials are generally used to reduce component overheating.

Therefore, there persists a need in the art for a densely packed electronic assemblage that operates at considerably cooler junction and board temperatures while permitting more and more components and electrical traces. Further, there is a need for a cost effective method of reducing the heat generated by hot components in electronic assemblages under high and ordinary service loads.

SUMMARY OF THE INVENTION

It is, therefore, an object of the invention to provide a densely packed electronic assemblage that is more reliable due to lower operating temperatures.

It is a feature of the invention that an electronic assemblage has a heat-removing element associated with a heat-generating element for reducing the junction temperature of the heat-generating component by means of a plurality of thermal vias.

The present invention is directed to overcoming one or more of the problems set forth above. Briefly summarized, according to one aspect of the present invention, a method of removing heat from a densely packed electronic assemblage comprises a densely packed electronic assemblage comprising a substrate medium for supporting at least one heat generating component thereon. The heat-generating component has a characteristic junction temperature $T_j$. A first heat removing element having a plurality of thermal vias is thermally associated with the heat generating component and reduces the junction temperature $T_j$ of the heat generating component. The heat-removing element is spaced apart from the heat-generating component so as to produce an open space nearest to the heat-generating component for accommodating high density electrical layouts. A heat sink in fluid communications with the first heat removing element absorbs heat from the heat generating component and thereby reduces its junction temperature $T_j$ to a temperature $T_l$, wherein $T_l$ is less than $T_j$.

The present invention has numerous advantages over prior art developments. More particularly, the densely packed electronic assemblage of the invention operates at lower temperatures and is, therefore, more reliable. Further, the electronic assemblage can allocate space in proximity to the heat-generating element for specific electrical traces essential for the design layout. Furthermore, the electronic assemblage of the invention may contain a larger number of standard and thinner width size components.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

Figure 1:
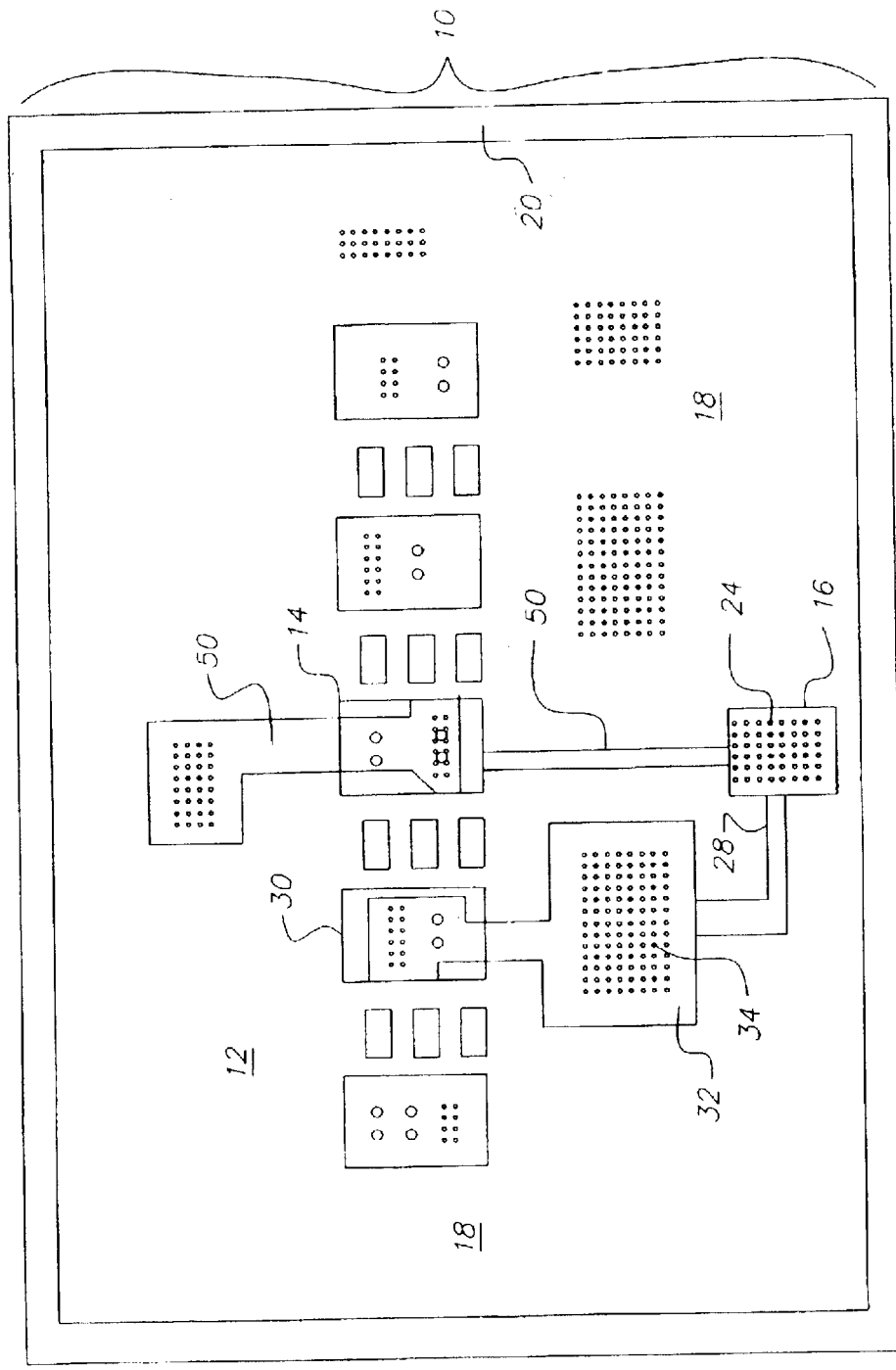
FIG. 1 is a plane view of a portion of an electronic assemblage in accordance with the invention.
Figure 2:
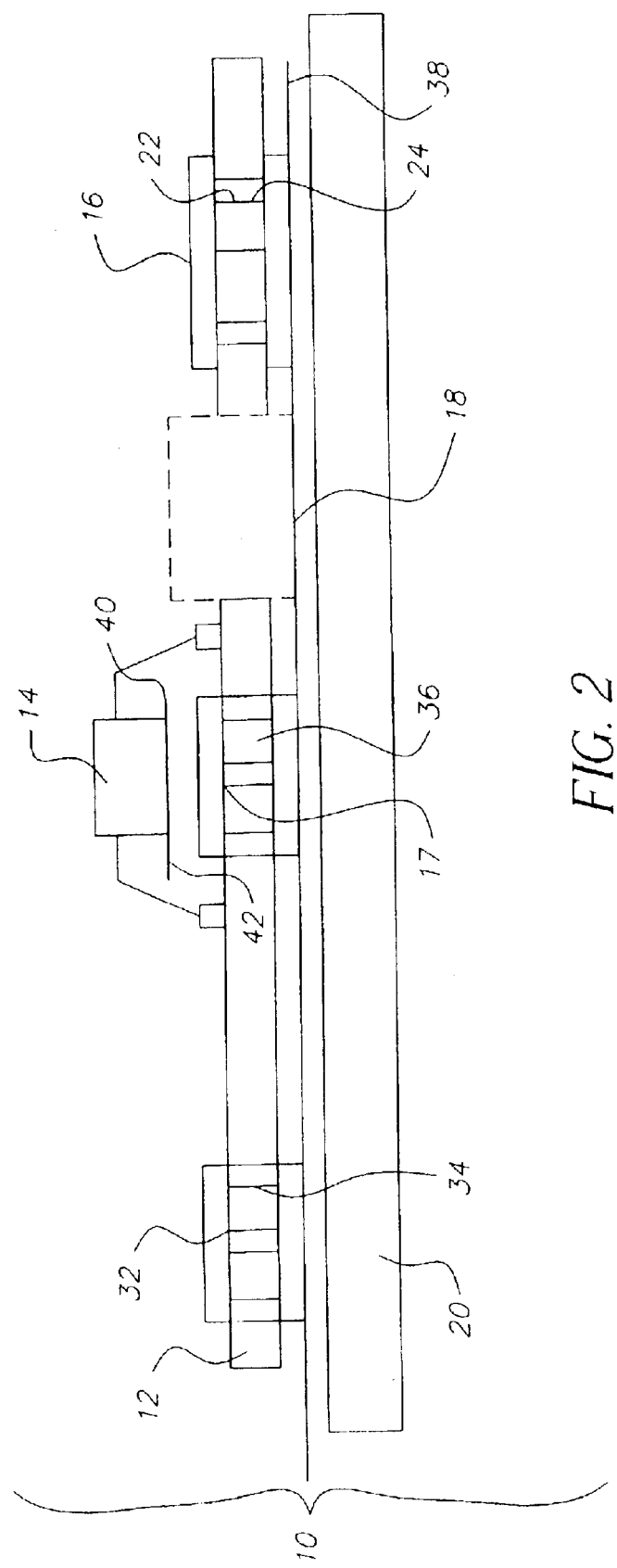
FIG. 2 is a cross-sectional view of an electronic assemblage in accordance with the invention.

Turning now to the drawings, and in particular to FIGS. 1 and 2, the densely packed electronic assemblage 10 of the invention is illustrated. Broadly defined, electronic assemblage 10 of the invention has a substrate medium 12, or typically a circuit board, having mounted thereon at least one heat generating components 14, 30. Heat generating component 14 may include any number of components that generate heat during operations or under load, such as resistors, diodes, transistors, processors, etc. Skilled artisans will appreciate that each heat generating component 14 has a characteristic junction temperature $T_j$, i.e., the die temperature during operation. During operations, as the heat generating component 14 approaches its maximum junction temperature, the prospect for component failure, and thus reliability problems becomes eminent. It is, therefore, important to the invention that each heat generating component 14 in the electronic assemblage 10 be associated with a novel and unobvious at least first heat removing element 16 for reducing the junction temperature $T_j$ of the heat generating component 14 to a temperature $T_l$, where $T_l$ is considerably less than T$_j$. This feature enables the electronic assemblage 10 to operate more reliably for a longer duration. First heat removing element 16, comprising a plurality of patterned thermal vias 24, forms a conduction path for carrying heat away from heat generating component 14, as described further below. Referring to FIG. 2, a heat sink 20 is preferably associated with first heat removing element 16. Heat sink 20 absorbs and transfers heat transported between the conduction path and the heat generating component 14. In this way, excess heat from overheated heat generating component 14 is continually directed away from the electronic assemblage 10, thereby preserving the reliability and performance of the electronic assemblage 10 and any heat sensitive component therein.

Figure 3:
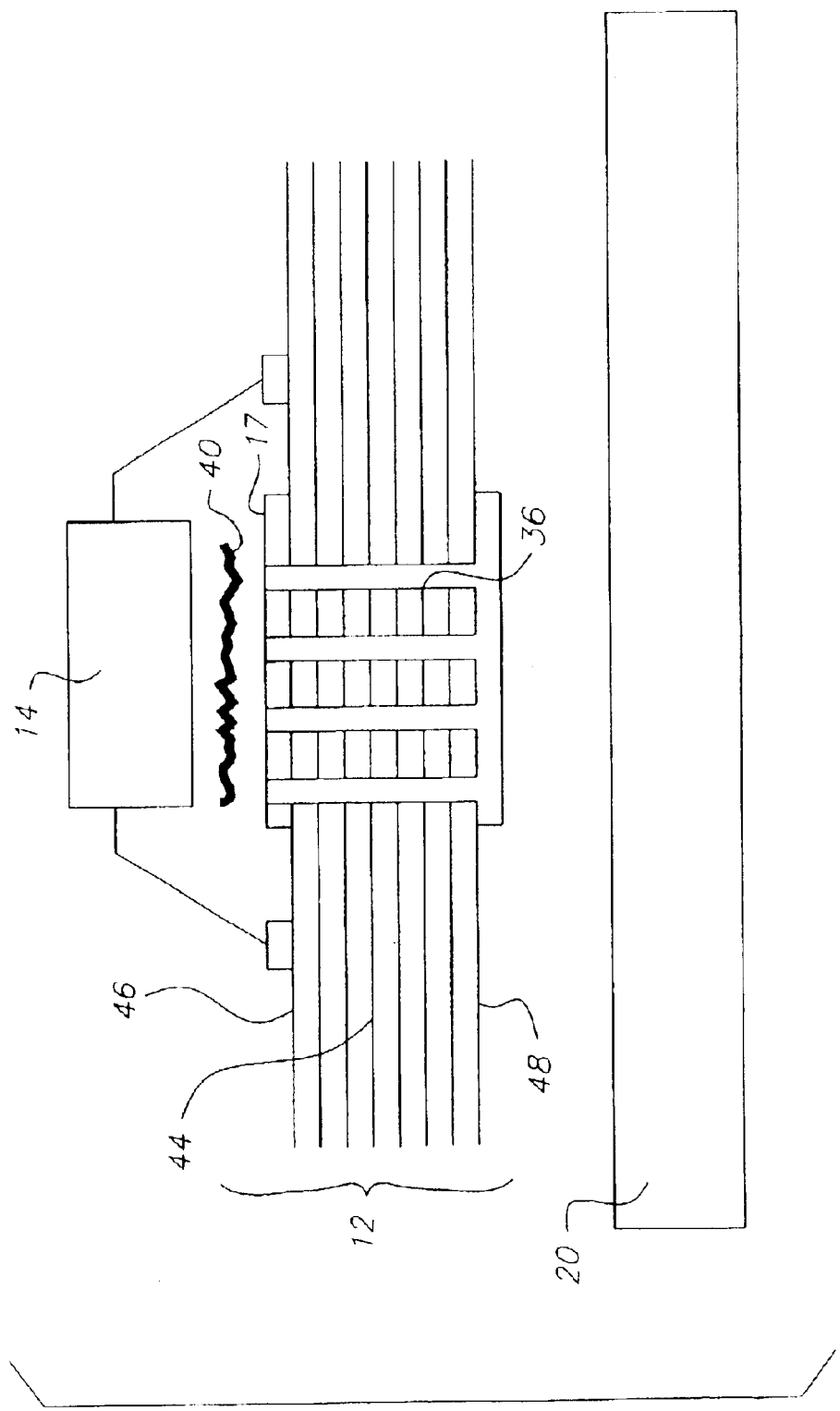
FIG. 3 is an enlarged partial sectional view of an electronic assemblage of the invention; and, FIG. 4 is a cross-sectional view of a multi-layer circuit board containing a first and a fourth heat removing element.

Referring to FIG. 3, substrate medium 12 of electronic assemblage 10 may be a multi-layer circuit board, e.g., a 14-layer polyimide circuit board that uses 1 oz. copper on the inner layers 44 and 2 oz. copper on the outermost layers 46, 48. Skilled artisans will appreciate that any circuit board material is contemplated by the invention, since the primary heat transfer mechanism is thermal conduction via the plurality of thermal vias 24 of heat removal element 16.

According to FIG. 1, in a preferred embodiment, substrate medium 12 uses copper as the base trace 50 with a plating of nickel gold (NiAu). Circuit boards of a variety of constructions and thickness could accomplish the same effect. Current industry standards for plating include palladium (Pd), nickel gold (NiAu), Immersion Tin, Immersion silver, and hot air solder level (HASL). Although the specific circuit board material used in the present invention is polyimide, it is of utmost importance that the thermal vias 24 of first heat removing element 16 can be drilled into the substrate medium 12. Additional materials that can be used as substrate medium 12 with similar success include assorted resins and resin composites.

Referring again to FIG. 1, it should be appreciated that practically any signal copper trace or power trace, even a "dummy" trace, may be utilized for the connecting path from heat generating component 14 to the thermal vias 24 of first heat removing element 16. In the preferred embodiment, a particular pattern of thermal vias 24 in first heat removing element 16 is arranged remotely from the heat generating component 14. According to FIG. 1, alternatively, a third heat removing element 32 with thermal vias 34 may also be positioned on a remote portion 18 of the substrate medium 12 away from the heat generating component 14. Third heat removing element 32 may alternatively be connected back to the first heat removing element 16 by connecting path 28.

Referring again to FIG. 2, in the preferred embodiment, a first heat removing element 16 is positioned proximate to the heat generating component 14. In this preferred design, first heat removing element 16 provides a specific cross-sectional area with thermal vias 24 to conduct heat from the topmost surface 46 to the bottommost surface 48 of the circuit board 12 (see FIG. 3). The final thermal transfer from the heat generating component 14 to the heat sink 20 takes place in the presence of a thermally conductive adhesive 40. It should be appreciated that multiple remotely positioned first and third heat removing elements 16, 32, respectively, may be associated with a single heat generating component 14 to improve heat transport. In addition, multiple first and third heat removing elements 16, 32 may be associated with multiple heat generating components, e.g., first and second heat generating components 14, 30 (shown in FIG. 1), to provide a dual heat transport system.

Referring to FIGS. 1 and 2, first heat removing element 16 may contain any number or size of thermal vias 24 to provide a conduction path between the outermost surfaces 46, 48 of the substrate medium or circuit board 12 to facilitate and improve the thermal management. As depicted in FIG. 1, in a preferred embodiment of the invention, heat-removing element 16 has a single group of thermal vias 24 remotely spaced about 1.0 inch away from the heat generating component 14 on substrate medium 12. It should be appreciated that a remote first heat removing element 16 having thermal vias 24 may be arranged in any number of patches or arrays and may be situated practically any distance away from the heat generating component 14, although closer is generally better. A skilled artisan will recognize that any layer may be used for the conduction path to the remotely positioned first heat removing element 16. Thermal conduction paths contemplated by the invention include electrical connections, non-electrical thermal connections, a fluid material connection between the heat generating component and first heat removing element, and surface bus wires, etc.

Referring again to FIG. 1, in the preferred embodiment, first heat removing element 16 is comprised of a plurality of regularly spaced thermal vias 24 formed in the substrate medium 12. Thermal vias 24 are generally round shaped and have a diameter of about 0.022 inches. Preferably, each one of the thermal vias 24 is spaced about 0.040 inches apart for optimum effectiveness in transporting heat. According to FIG. 2, in the preferred embodiment, the thermal vias 24 are filled with a thermally conductive material 22. Preferred materials include a material selected from the group consisting of: tin-lead solder; silver solder; thermally conductive liquid silicon adhesive; and thermally conductive liquid epoxy adhesive. Additionally, the same or another thermally conductive adhesive 40 may be disposed in the open space 42 produced between the heat generating component 14 and the substrate medium 12 thereby thermally connecting the heat generating component 14 and the second heat removing element 17 with thermal vias 36.

Turning again to FIG. 2, in a preferred embodiment of the invention, an aluminum heat sink 20 about 0.090 inches thick is associated with the substrate medium or circuit board 12. Heat sink 20 is attached to substrate medium or circuit board 12 with a thermally conductive material 38, preferably a Dow Corning silicone thermally conductive, electrically isolative adhesive (1-4174™). This particular adhesive material comprises 7-mil glass beads to facilitate the finished bonding spacing between the circuit board 12 and the heat sink 20. Of course, practically any metal heat sink 20 having a range of thickness may be used with substantially similar results.

Further, practically any thermally conductive adhesive (including epoxies and sheet films) may be used to bond the heat sink 20 and substrate medium 12 with similar results. Generally, any material that can bond any circuit board to any rigidizer with even a nominal thermal conductivity may be used since the heat has the entire circuit card area to transfer through the adhesive. Even if substrate medium or circuit board 12, and heat-sink 20 are somehow clamped together to provide a thermal path, the first heat removing element 16 of the invention could still be used to reduce the heat of the heat generating components 14 thereon.

Figure 4:
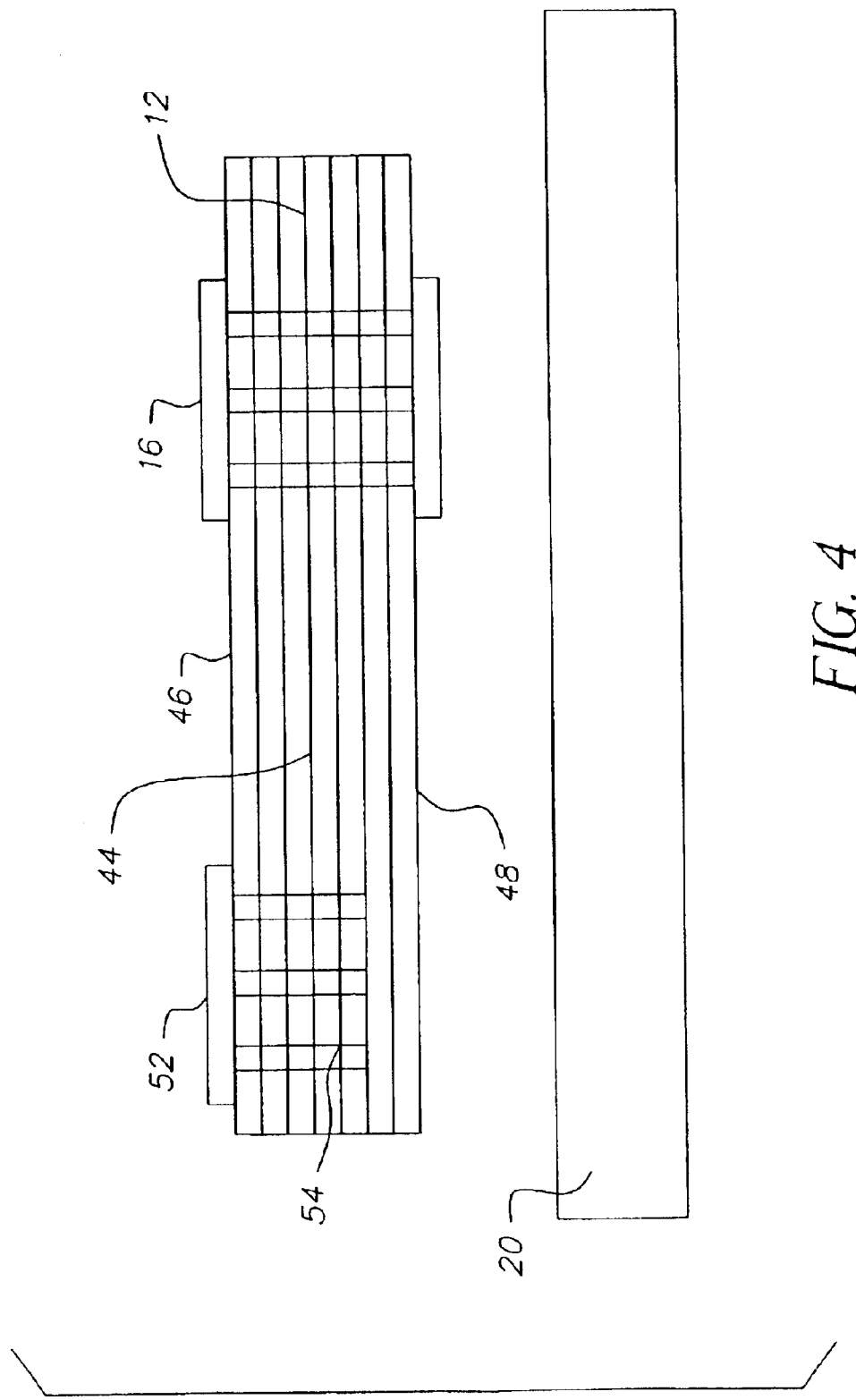

Skilled artisans will again appreciate that a wide range of thermally and electrically conductive adhesives is within the contemplation of the invention. In the preferred embodiment, an electrically isolative adhesive is used due to trace population on the bottom layer of the circuit board 12. Otherwise a shorting path to the heat sink 20 will exist. However, an electrically homogeneous layer (or partial layer) with the same signal as the thermal vias 24 may also be used. According to FIG. 4, in this latter design, the thermal vias 54 of fourth heat removing element 52 would pass through the circuit board 12 and electrical vias would terminate at some layer above bottommost layer 48. It should be appreciated that this latter design is a more expensive board to manufacture, but one that enables the use of higher conductive (electrically or thermally) material since adhesives that are electrically conductive can be more thermally conductive.

Referring once again to FIG. 1, thermal vias 24 of first heat removing element 16 may be filled with a solder material 22 (as described above) to increase the effectiveness of the thermal vias 24 in removing heat from the heat generating component 14. Alternatively, the thermal vias 24 of first heat removing element 16 may remain unfilled or may be filled with a different thermally conductive material. In the case of filling the thermal vias 24 of first heat removing element 16 with solder, a hand application or a specially designed solder paste stencil may be used. The specially designed solder paste stencil would have increased cut-out size to allow for the extra volume of solder required to fill the holes during processing. The actual increase in size can be calculated by adding the volume of the thermal vias 24 of first heat removing element 16 to the normal volume of solder paste desired.

Referring again to FIGS. 1 and 2, with the remote thermal vias 24 of first heat removing element 16, the substrate medium or circuit boards 12, can be made of any material and used for any industry. The components specifically addressed are large plastic or ceramic components with lead frames, such as quad flat packs or dips, but it is additionally suited to even higher I/O component packages such as BGAs of any type. For extremely hot components, this method of providing remote vias 24 for cooling will dramatically reduce the junction temperatures of the heat generating components which will improve the life and reliability of the component and thus the board and module. This method is especially useful where there is minimal area underneath proximate to the component for thermal vias due to critical electrical routing requirements. This is a common problem in all industries due to the ever-increasing number of I/O pins required on components. This arrangement of first heat removing element 16 remotely located relative to the heat generating component 14 will help any package, but is generally used on these more densely packed electrical components that are routing space critical. The thermal vias 24 of first heat reducing element 16 are made as "thermally conductive" as possible with the addition of solder inside the through-opening, as previously described. Any diameter size via can be used, but the optimum size (copper area vs. cost of drilling smaller holes and more of them) is currently around 0.022 inches in diameter (finished size). Additionally any "circuit" or "net" can be used, but the optimum for most designs is the "ground" nets. This effectively maximizes the transfer to the heat sink 20, which is typically "grounded." This is typical of a bonded board assembly, but can additionally be used in a wedge-lock or direct fastener to chassis configuration where the heat transport is restricted to the mounting to the frame, card guide, or chassis. Additionally, a thermal conductive, electrically isolative silicone adhesive was used directly under the component to maximize heat transfer from the case of the component to the underlying copper ground paths. For BGA type components, the term "lead" would be replaced with the word "ball." Conceptually, it is the same—using the grounding copper nets on the board to transfer heat to a remote area where the thermal vias can be placed. The extra ground nets have an additional benefit in making the circuit board less "noisy" electrically, which minimizes cross-talk issues.

The invention has been described with reference to a preferred embodiment thereof. However, it will be appreciated that variations and modifications can be effected by a person of ordinary skill in the art without departing from the scope of the invention.

Parts List 10 electronic assemblage
12 substrate medium or circuit board
14 first heat generating element
16 first heat removing element
17 second heat removing element
18 remote portion of substrate medium 12
20 heat sink
22 thermally conductive material
24 thermal vias in first heat removing element 16
28 connecting path from first heat removing element 16 to third heat removing element 32
30 second heat generating element
32 third heat removing element
34 thermal vias in third heat removing element 32
36 thermal vias in the second heat removing element 17
38 thermally conductive material between the substrate 12 and the heat sink 20
40 thermally conductive adhesive between first heat generating element 14 and second heat removing element 17
42 open space (described in description of part number 40)
44 inner layers of substrate medium 12
46 topmost layer of substrate medium 12
48 bottommost layer of substrate medium 12
50 base trace connecting first and third heat removing elements
52 fourth heat removing element
54 thermal vias in fourth heat removing element

What is claimed is:

1. A method of removing heat from a densely packed electronic assemblage, comprising the steps of:
    providing a densely packed electronic assemblage comprising a substrate medium for supporting at least one heat generating component having a characteristic junction temperature of value $T_j$;
    providing a heat removing element having a plurality of thermal vias;
    spacing said heat removing element and said at least one heat generating component apart and providing a space nearest to said at least one heat generating component for accommodating high density electrical layouts;
    forming a thermal transport path between said heat removing element and said at least one heat generating component; and
    extending said thermal transport path to a heat sink to absorb heat from said at least one heat generating component and thereby reduce actual junction temperature of said at least one component to a value $T_j$, wherein $T_j$, is less than $T_j$.

2. The method recited in claim 1 including the step of applying a first thermally conductive material between said heat removing element and said at least one heat generating component.

3. The method recited in claim 2 including the step of filling said plurality of thermal vias with a second thermally conductive material.

4. The method recited in claim 3 including the step of applying a third thermally conductive material between the substrate medium and said heat sink.

5. The method recited in claim 2 wherein said step of applying a first thermally conductive material comprises the step of selecting said first thermally conductive material from materials selected from the group consisting of a thermally conductive liquid silicone adhesive; a thermally conductive liquid epoxy; a thermally conductive silicone film; and, a thermally conductive epoxy film.

6. A method of removing heat from a densely packed electrical assemblage, comprising the steps of:

providing a densely packed electrical assemblage comprising a substrate media for supporting at least one heat generating component having a characteristic junction temperature of value $T_j$;

providing a heat removing element having a plurality of thermal vias;

forming a thermal transport path between said heat removing element and said at least one heat generating component; and extending said thermal transport path to a heat sink to absorb heat from said at least one heat generating component and thereby reduce actual junction temperature of said at least one component to a value $T_j$, wherein $T_j$, is less than $T_j$.

7. The method recited in claim 6 including the step of applying a first thermally conductive material between said heat removing element and said at least one heat generating component.

8. The method recited in claim 7 including the step of filling said plurality of thermal vias with a second thermally conductive material.

9. The method recited in claim 8 including the step of applying a third thermally conductive material between the substrate media and said heat sink.

10. The method recited in claim 7 wherein said step of applying a first thermally conductive material comprises the step of selecting said first thermally conductive material from materials selected from the group consisting of a thermally conductive liquid silicone adhesive; a thermally conductive liquid epoxy; a thermally conductive silicone film; and, a thermally conductive epoxy film.

11. A method of removing heat from a densely packed electrical assemblage, comprising the steps of:

providing a densely packed electrical assemblage comprising a substrate media for supporting at least one heat generating component having a junction temperature $T_j$;

providing a heat removing element having a plurality of thermal vias;

forming a thermal transport path between said heat removing element and said at least one heat generating component, said heat removing element and said at least one heat generating component being spaced apart so as to provide space nearest to said at least one heat generating component for accommodating high density electrical layouts; and extending said thermal transport path to a heat sink to absorb heat from said at least one heat generating component and thereby reduce actual junction temperature of said at least one heat generating component to a value $T_j$, wherein $T_j$, is less than $T_j$.

12. The method recited in claim 11 including the step of applying a first thermally conductive material between said heat removing element and said at least one heat generating component.

13. The method recited in claim 12 including the step of filling said plurality of thermal vias with a second thermally conductive material.

14. The method recited in claim 13 including the step of applying a third thermally conductive material between the substrate media and said beat sink.

15. The method recited in claim 12 wherein said step of applying a first thermally conductive material comprises the step of selecting said first thermally conductive material from materials selected from the group consisting of a thermally conductive liquid silicone adhesive; a thermally conductive liquid epoxy; a thermally conductive silicone film; and, a thermally conductive epoxy film.

* * * * *